United States Patent [19]
Michel et al.

[11] Patent Number: 5,964,897
[45] Date of Patent: Oct. 12, 1999

[54] INTEGRATED STRUCTURE FOR A CONVOLUTIVE VITERBI DECODER

[75] Inventors: Thierry Michel, Brignoud; François Remond, Saint Hilaire du Touvet, both of France

[73] Assignee: SGS-Thomson Microelectronics S.A., Saint Genis, France

[21] Appl. No.: 08/801,479

[22] Filed: Feb. 18, 1997

[30] Foreign Application Priority Data

Feb. 28, 1996 [FR] France ............................ 96 02647

[51] Int. Cl.$^6$ .................................................. G06F 11/10
[52] U.S. Cl. ..................... 714/795; 714/792; 714/794; 714/796; 375/261; 375/262; 375/265; 375/340; 375/341
[58] Field of Search .................. 371/43.7, 43.6, 371/43.8, 43.4; 375/265, 262, 261, 341, 340

[56] References Cited

U.S. PATENT DOCUMENTS

| | | | |
|---|---|---|---|
| 4,924,492 | 5/1990 | Gitlin et al. | 379/93 |
| 5,068,859 | 11/1991 | Collins et al. | 371/43 |
| 5,134,690 | 7/1992 | Samatham | 395/200 |
| 5,390,198 | 2/1995 | Higgins | 371/43 |
| 5,491,705 | 2/1996 | Pradhan et al. | 371/43 |

OTHER PUBLICATIONS

French Search Report from French Patent Application No. 96 02647, filed Feb. 28, 1996.

IEEE Journal of Solid–State Circuits, Dec. 1992, USA, vol. 27, No. 12, ISSN 0018–9200, pp. 1877–1885 Black, P.J., et al. "A 140–Mb/s, 32–state, radix–4 Viterbi Decoder".

Globecom '90: IEEE Global Telecommunications Conference and Exhibition, "Communications: Connecting The Future" (CAT. No. 90CH2827–4), San Diego, CA, USA, Dec. 2–5, 1990, ISBN 0–87942–632–2, 1990 New York, NY, USA, IEEE, pp. 1787–1793 vol. 3, Shung C.B., et al., "Area–Efficient Architectures For The Viterbi Algorithm".

Globecom '90: IEEE Global Telecommunications Conference and Exhibition, "Communications Connecting The Future" (CAT. No. 90CH2827–4), San Diego, CA, USA, Dec. 2–5, 1990, ISBN 0–87942–632–2, 1990 New York, NY, USA, IEEE, USA, pp. 1323–1327, vol. 2, Meier S.R., "A Viterbi Decoder Architecture Based on Parallel Processing Elements".

*Primary Examiner*—William Grant
*Assistant Examiner*—McDieunel Marc
*Attorney, Agent, or Firm*—Wolf, Greenfield & Sacks, P.C.

[57] ABSTRACT

An integrated structure of a network of N add-compare-select (ACS) units associated with N states of a trellis of a Viterbi convolutive decoder. The ACS units are physically gathered by pairs juxtaposed to form two spaced apart parallel columns, each pair including two ACS units associated, respectively, with states 2n and 2n+1 modulo-N (n being a positive integer). Each of the two ACS units of the pair is coupled, for receiving two path metrics, to an ACS unit associated with one of states n and n+N/2 of a close pair and to an ACS unit associated with the other of states n and n+N/2 of a remote pair. The space between the two columns constitutes a common channel that includes the interconnections between remote pairs of units. The structure is implemented in a technology with at least three metallization layers and wherein the two ACS units of each pair are juxtaposed along the column height.

28 Claims, 4 Drawing Sheets

ACS(2n)

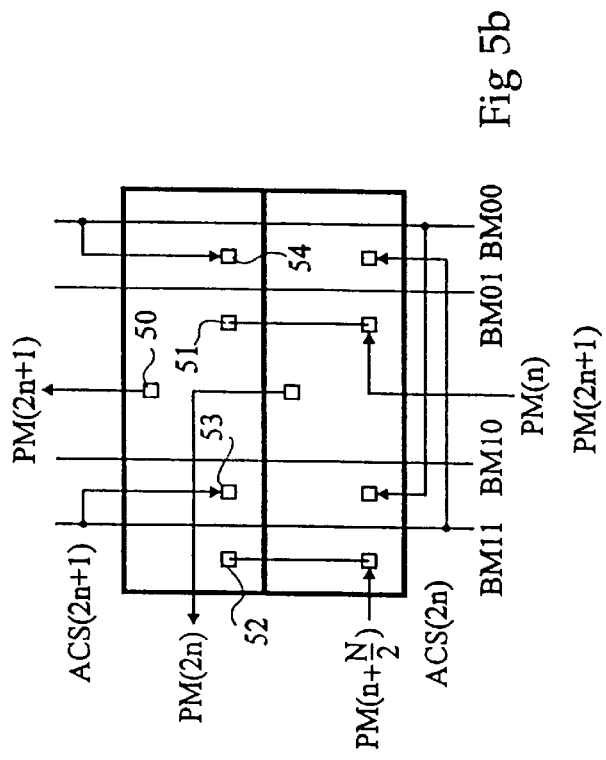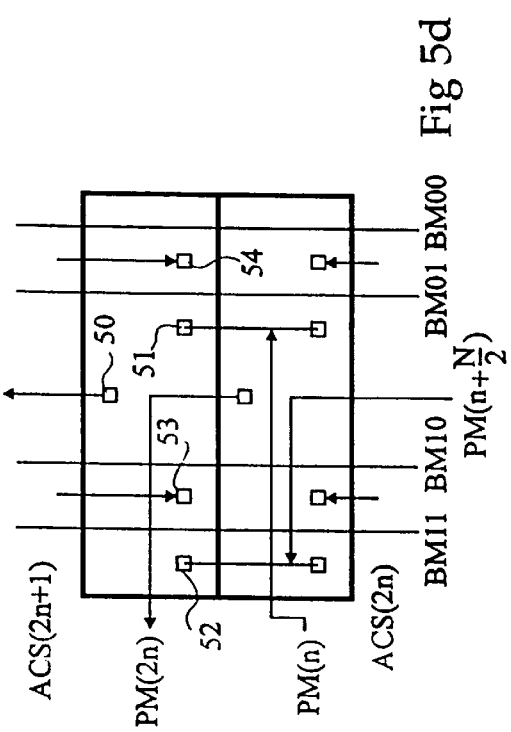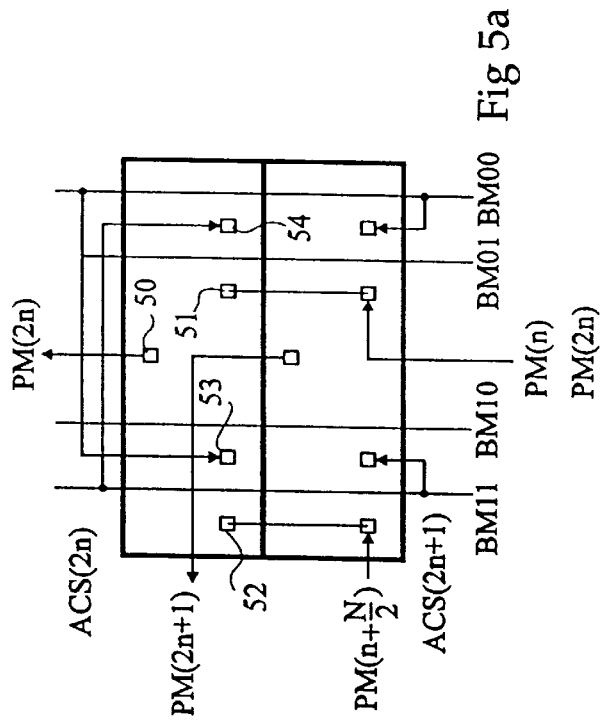
Fig 5a  Fig 5b  Fig 5c  Fig 5d

INTEGRATED STRUCTURE FOR A CONVOLUTIVE VITERBI DECODER

BACKGROUND OF THE INVENTION

1. Field of the Invention

The present invention relates to an integrated circuit structure for a convolutive Viterbi decoder, and more specifically to the integrated structure for the add-compare-select units of the decoder.

2. Discussion of the Related Art

Convolutive coding and decoding are used to reduce the amount of errors in digital signal transmission. In a convolutive Viterbi decoder, one add-compare-select unit (ACS) is associated with each node of a so-called "trellis". Each node of the trellis corresponds to a possible state of a shift register used in convolutive coding.

Since the present invention relates only to the interconeect structure of ACS units, it is not necessary to recall the operation of a convolutive Viterbi decoder which is well known in the art. Only those elements necessary for the understanding of the invention are described hereafter.

FIG. 1 illustrates a generic trellis for building any N-state trellis. A state 2n and a state 2n+1 are both linked to a state n and a state n+N/2. Number n is any positive integer and numbers 2n and 2n+1 are defined modulo-N. The links between states correspond to transitions determined by symbols received by the decoder. In this example, each symbol contains two information bits. The transitions from state n to state 2n and from state n+N/2 to state 2n+1 correspond to the reception of a symbol ab, where a is equal to 1 or 0 and b is equal to 1 or 0 according to the value of 2n. The transitions from state n to state 2n+1 and from state n+N/2 to state 2n correspond to the reception of symbol $\overline{ab}$.

FIG. 2 shows essential components of the ACS unit associated with state 2n. This unit ACS(2n) is meant to update an associated path metric PM(2n) in a register 10 and to issue a decision D(2n). Each path metric is a 7-bit number, for example.

Unit ACS(2n) includes an adder 12 which receives path metric PM(n) of the ACS unit associated with state n and a branch metric BMab associated, in the present example, with symbol ab. A second adder 13 receives the path metric PM(n+N/2) issued by the ACS unit associated with state n+N/2 and a branch metric $\mathrm{BM}\overline{ab}$ associated, in the present example, with symbol $\overline{ab}$.

A branch metric BMx is a five-bit number, for example, which is smaller as the probability of having received the corresponding symbol x increases. Similarly, for a given ACS unit, the lower the value of a path metric PM(y), the more likely it is for the received symbol to be the one corresponding to the transition of state y to the state associated with the ACS unit.

Decision D(2n) is issued by a comparator 15 receiving the outputs of adders 12 and 13. It controls a multiplexer 17 to select, from among the outputs of adders 12 and 13, that output with the lowest value. Thus, decision D(2n) indicates the most likely preceding state among states n and n+N/2. The output of multiplexer 17 is stored in register 10 as the path metric PM(2n) to be used upon receipt of the following symbol.

The ACS unit associated with state 2n+1 is similar to that of FIG. 2, except that adder 12 receives branch metric $\mathrm{BM}\overline{ab}$ and adder 13 receives branch metric BMab.

In currently used convolutive decoders, the trellis has a relatively significant size, for example of 64 states. Thus, the interconnections between ACS units become complex and particular care is required for the positioning and routing of these ACS units on an integrated circuit so as not to occupy a large surface area and affect the operating speed.

An optimized solution for the positioning and routing of ACS units has been found by Sparso and is described in IEEE Journal of Solid State Circuits, Vol. 26, n° 2, February 1991, pp. 90–97, "An Area-Efficient Topology for VLSI Implementation of Viterbi Decoders and Other Shuffle-Exchange Type Structures".

FIG. 3 illustrates the general principle of Sparso's placing and routing. The ACS units are gathered by pairs in two columns separated by a common routing channel 20. Each pair includes, juxtaposed along the width of the corresponding column, the units associated with states 2n and 2n+1 (modulo-N, n being any number). These two ACS units receive the path metric PM issued by the ACS unit associated with state n or with state n+N/2 which is located, as shown, in a previous close pair, on the side away from the common channel 20. The missing path metric arrives to the ACS units associated with states 2n and 2n+1 via common channel 20. There remains a local routing channel 22 between two pairs of ACS units.

FIG. 4 schematically illustrates an ACS network structure, obtained by using the Sparso method in the example of a 64-state trellis. The ACS units are illustrated by cells designated by the associated states.

The Sparso method is optimal when using integration technologies with two metallization layers. However, in more recent technologies, there are three metallization layers. When the Sparso method is transposed to a technology with three metallization layers, the size of the ACS network cannot be significantly reduced with respect to the same trellis implemented in a technology with two metallization layers.

SUMMARY OF THE INVENTION

An object of the present invention is to provide an optimal integrated structure of an ACS network in a technology with three metallization layers.

This object is achieved by means of an integrated structure of a network of N add-compare-select (ACS) units associated with N states of a trellis of a Viterbi convolutive decoding, wherein the ACS units are physically gathered by pairs juxtaposed to form two spaced apart parallel columns, each pair including two units associated, respectively, with states 2n and 2n+1 modulo-N, and each of which is coupled, for receiving two path metrics, to a unit associated with one of states n and n+N/2 of a close pair and to a unit associated with the other of states n and n+N/2 of a remote pair, the space between the two columns constituting a common channel including the interconnections between remote pairs of units. The structure is implemented in a technology with at least three metallization layers and the two ACS units of each pair are juxtaposed along the column height.

According to an embodiment of the present invention, the ACS units have a same topology and each pair has a link metallization topology adapted to one of the four following configurations:

(0) the unit associated with state 2n is coupled to the next close pair and to the unit associated with state n of the preceding close pair;

(1) the unit associated with state 2n+1 is coupled to the next close pair and to the unit associated with state n of the preceding close pair;

(2) the unit associated with state 2n is coupled to the next close pair and to the unit associated with state n+N/2 of the preceding close pair; and (3) the unit associated with state 2n+1 is coupled to the next close pair and to the unit associated with state n+N/2 of the preceding close pair.

According to an embodiment of the present invention, each ACS unit of a pair is coupled to two groups of branch metric supply lines out of four groups of branch metric supply lines, the four groups of branch metric supply lines being common to each column.

According to an embodiment of the present invention, each ACS unit includes first to third groups of pads for establishing the connections with the next close pair and the units associated with states n and n+N/2, respectively, and fourth and fifth groups of pads for establishing connections with the two corresponding groups of branch metric supply lines, respectively, all pads being arranged according to a topology common to all units.

According to an embodiment of the present invention, the pads of each group of pads are distributed along the width of the corresponding column, the pads associated with most significant bits being on the side away from the common channel, where circuitry common to the two units of the corresponding pair is integrated.

BRIEF DESCRIPTION OF THE DRAWINGS

These objects, features, and advantages of preferred, non-limiting embodiments of the present invention will be described by way of example with reference to the accompanying drawings, n which:

FIG. 5 schematically illustrates four physical configurations of a group of ACS units according to an embodiment of the present invention, which constitute "assembly blocks" for realizing an ACS network according to the present invention.

DETAILED DESCRIPTION

Figure 1:
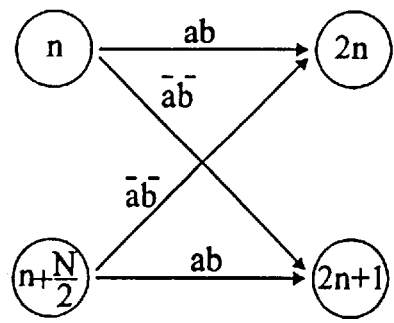
FIG. 1 illustrates a generic trellis for building an N-state trellis.
Figure 2:
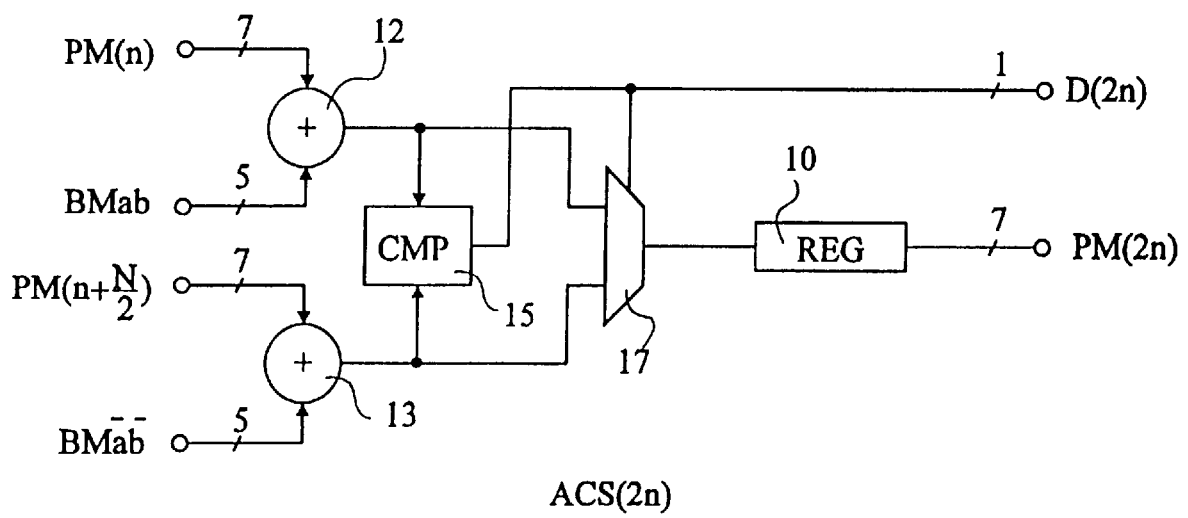
FIG. 2 illustrates components of an ACS unit associated with state 2n.
Figure 3:
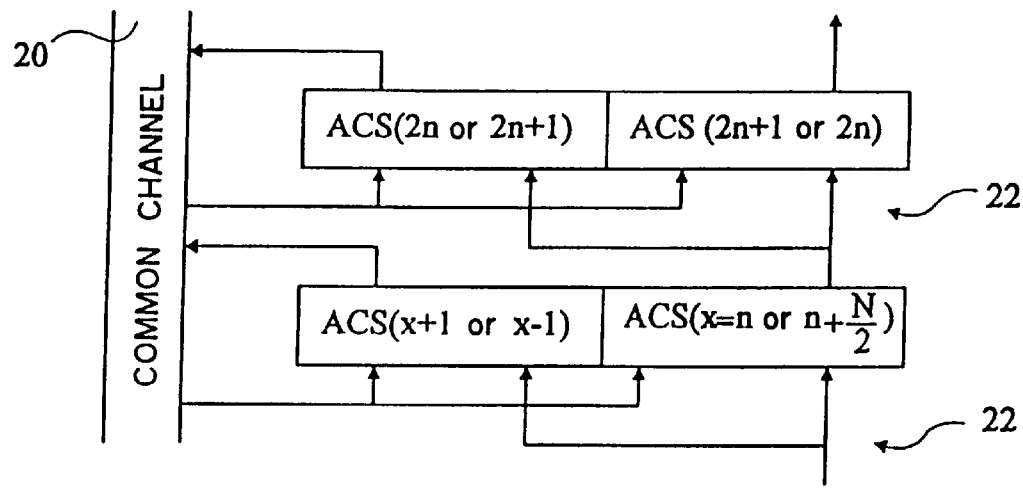
FIG. 3 schematically illustrates the placement and routing of ACS units according to Sparso's topology.
Figure 4:
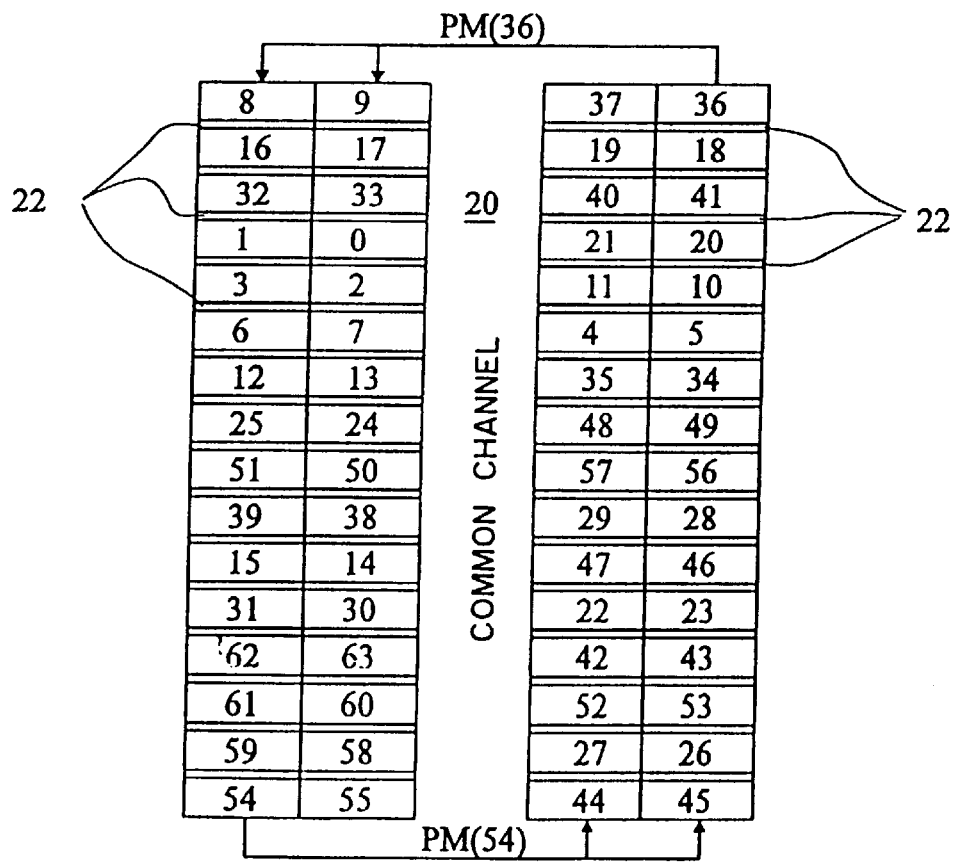
FIG. 4 schematically illustrates an ACS structure for a 64-state trellis according to Sparso's topology.

The present invention aims at optimally integrating the add-compare-select (ACS) units of a convolutive Viterbi decoder in a technology with three metallization layers. For this purpose, the invention is partially based on the Sparso structure (FIGS. 3 and 4). The Sparso structure is optimal for integration technologies with two metallization layers. However, by merely transposing this structure to a technology with three metallization layers, the occupied surface cannot be significantly reduced. In particular, the local routing channels 22 separating the pairs of ACS units in each column cannot be avoided.

According to an embodiment of the present invention, ACS unit pairs determined by the Sparso method are used, but the ACS units of each pair, instead of being juxtaposed along the width of the columns, are juxtaposed along their height. Each ACS unit is thus distributed throughout the width of the corresponding column. As a result, the connections between the ACS units of a same pair are very short and vertical. Space is thus freed for horizontal connections and it is used for the connection of the ACS units to the path metrics PM of common channel 20. The local routing channels 22 can be practically eliminated.

The surface occupied by an ACS network according to the present invention is approximately three times lower than that of the Sparso structure. The surface reduction has the further advantage of increasing the limit operating frequency of the convolutive Viterbi decoder.

According to an embodiment of the present invention, the first ACS unit of a pair, that is, the unit which issues the path metric PM to the next close pair, corresponds to a unit on the side away from the common channel in the Sparso structure. In order to simplify the design of the integrated structure, the ACS units have a same topology. To further simplify the design, it is desirable to juxtapose column elements with the least possible concern for routing these elements.

For this purpose, the present invention provides four configurations of ACS unit pairs which, by juxtaposing them to form a column, practically establish all the links internal to the column. Thus, once a column is formed by choosing the configurations according to the pairs to be obtained, only the links external to the column practically remain to be routed, in particular those between remote pairs which go through the common channel.

FIG. 5 schematically illustrates each of these four configurations. Each ACS unit associated with state 2n or 2n+1 of the trellis includes a pad 50 for issuing the path metric PM; a pad 51 for receiving path metric PM(n) from the unit associated with state n; a pad 52 for receiving path metric PM(n+N/2) from the unit associated with state n+N/2; and two pads 53 and 54 for respectively receiving the two corresponding branch metrics BM among the four possible branch metrics.

The four possible branch metrics BM00, BM01, BM10 and EM11 are distributed to all the units of a column by lines extending through the column height. The connections of pads 53 and 54 to the branch metric lines are achieved by vertical lines running out of the pairs of units where, in reduced local routing channels, they horizontally join the corresponding lines BM. This is shown for configurations 0 and 1 in which, as an example, pads 53 and 54 of unit ACS(2n) respectively receive metrics BM00 and BM11 and pads 53 and 54 of unit ACS(2n+1) respectively receive metrics BM11 and BM00.

Each path metric PM or branch metric BM is a value of several bits which is in fact associated with a group of pads distributed along the column width.

The nature of the links to be established in the local routing channels is such that the surface occupied by these local channels is negligible (approximately 5% against approximately 30% in the Sparso architecture).

The topologies of the ACS units are identical and the internal assignments of pads 50 to 54 should not be modified. The four configurations differ from one another by the metallizations which connect pads 50 through 54 to the outside. The metallizations are only shown for the connections which vary from one configuration to another. Of course, the units include other pads, for example, pads for receiving supply voltages and control and clock signals. The metallizations corresponding to those other pads, not shown, are the same for each of the four configurations, and they are designed to properly interconnect when the pairs are juxtaposed.

In configuration 0, the ACS unit associated with state 2n issues path metric PM(2n) to the next close pair. The two units of the pair receive the metric PM(n) of the preceding close pair. Path metric PM(2n+1) is issued to the common channel and path metric PM(n+N/2) is received from the common channel.

In configuration 1, the ACS units are swapped with respect to configuration 0, that is, the unit associated with state 2n+1 issues path metric PM(2n+1) to the next close pair. The only difference from configuration 0 is the external assigement of pads 50 through 54, which differentiates the way in which the pair of units is routed with the outside, as is shown for the connections with branch metrics BM00 and BM11.

In configuration 2, the unit associated with state 2n issues its path metric PM(2n) to the next close pair, and the two units receive path metric PM(n+N/2) from the preceding close pair. Path metric PM(2n+1) is issued to the common channel and path metric PM(n) is received from the common channel.

In configuration 3, the ACS units are swapped with respect to configuration 2, that is, the unit associated with state 2n+1 issues its path metric PM(2n+1) to the next close pair. The only difference from configuration 2 is the external assignment of pads 50 through 54.

The only topological difference between configurations 0 and 2 and between configurations 1 and 3 is the swapping of the connections to the pads 51 and 52 receiving the path metrics PM of a close pair and of a remote pair.

In these four configurations, connection crossings have been shown. Of course, these connections are implemented on two metallization layers.

Once the columns have been formed by juxtaposing the pairs, the connections which are not made by the juxtaposition are routed automatically, especially the connections of common channel 20 and the connections to the branch metric lines through the reduced local channels.

An advantage of the present invention is that some circuitry can be shared, without restraints, by the two units of each pair. This is in particular the case for a normalization circuit which is meant to control the overflow of path metric registers 10. This shared circuitry is located on the most significant bit side of the ACS units, that is, on the outer side of the circuit, the least significant bits being located on the side of central channel 20. This minimizes the connection length between two remote units, and thus increases the circuit speed.

In contrast, in the Sparso structure, a shared normalization circuit should be placed between the two units of a pair. The two units would then have symmetrical topologies, since the most significant bits should be on the side of the central normalization circuit. This symmetry would lead to an imbalance in length between the least significant lines on the side of the common channel and the least significant lines on the opposite side. This imbalance would lead to a decrease of the operating frequency.

Figure 6:
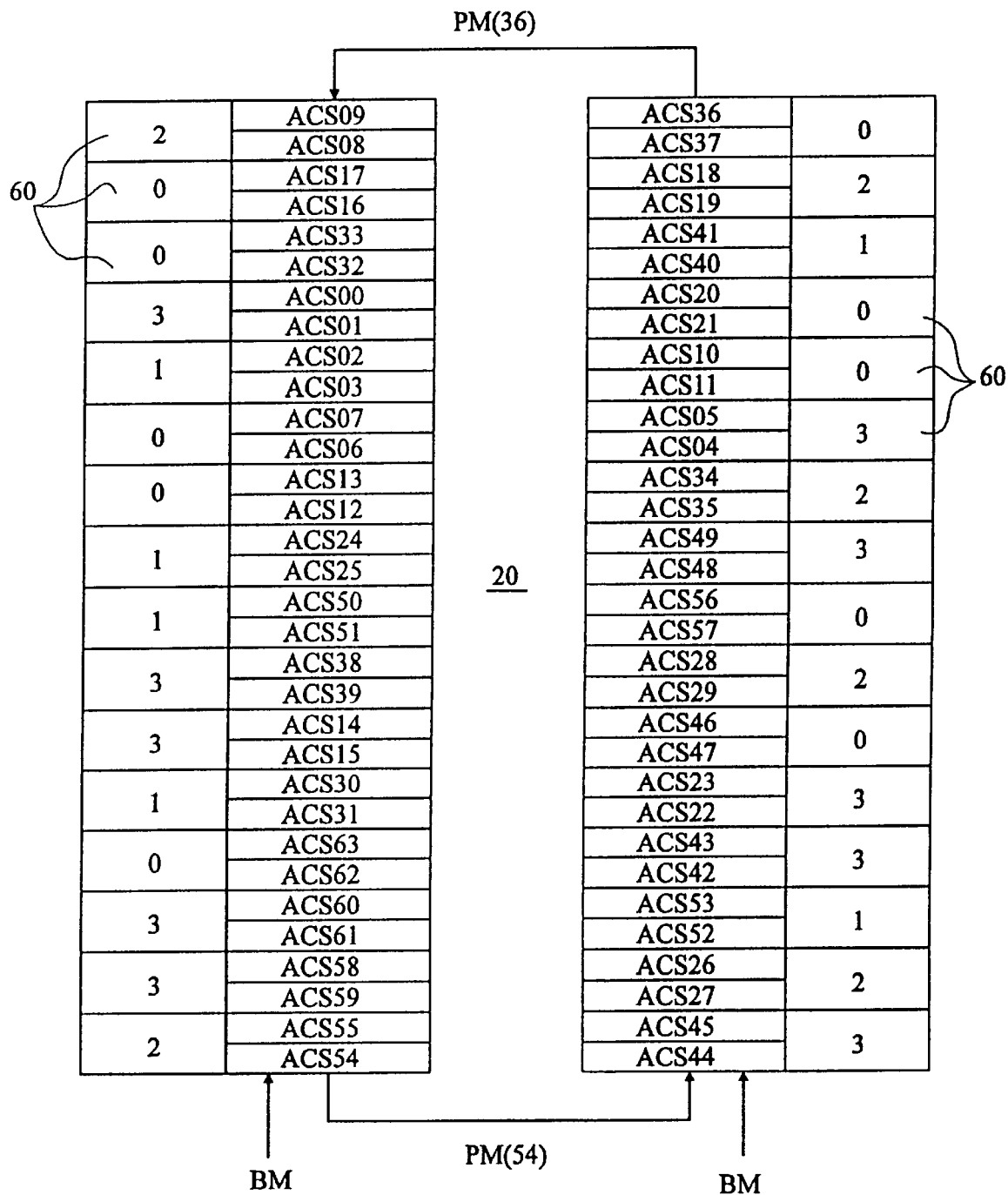
FIG. 6 schematically illustrates a structure of an ACS network obtained according to an embodiment of the present invention in the example of a 64-state trellis.

FIG. 6 schematically illustrates an integrated structure obtained according to the invention of a network of ACS units in the example of a 64-state trellis. The number of the configuration used for each pair is indicated in a box 60 next to each pair, this box standing for the circuits shared between the two units of the pair.

Having thus described at least one illustrative embodiment of the present invention, various alterations, modifications, and improvements will readily occur to those skilled in the art. Such alterations, modifications, and improvements are intended to be within the spirit and the scope of the present invention. Accordingly, the foregoing description is by way of example only and is not intended as limiting. The present invention is limited only as defined in the following claims and the equivalents thereto.

What is claimed is:

1. An integrated structure for a network of N add-compare-select units associated with N states of a trellis of a Viterbi convolutive decoder, wherein within the integrated structure the N add-compare-select units are physically gathered by pairs of add-compare-select units juxtaposed to form two spaced apart parallel columns, each pair of add-compare-select units including two add-compare-select units associated, respectively, with states 2n and 2n+1 modulo-N where n is a positive integer, and each add-compare-select unit of the pair being coupled, for receiving two path metrics, to an add-compare-select unit associated with one of states n and n+N/2 of a close pair of add-compare-select units and to an add-compare-select unit associated with the other of states n and n+N/2 of a remote pair of add-compare-select units, a space between the two columns constituting a common channel including interconnections between remote pairs of add-compare-select units, wherein the integrated structure is implemented in a technology with at least three metallization layers and wherein the two add-compare-select units of each pair of add-compare-select units are physically juxtaposed withing the integrated structure along a column height of a respective column of the two columns.

2. The integrated structure of claim 1, wherein the N add-compare-select units have a same topology and each pair of add-compare-select units has a connection metallization topology adapted to one of four following configurations:

(A) the add-compare-select unit associated with state 2n is coupled to a next close pair of add-compare-select units and to the add-compare-select unit associated with state n of a preceding close pair of add-compare-select units;

(B) the add-compare-select unit associated with state 2n+1 is coupled to the next close pair of add-compare-select units and to the add-compare-select unit associated with state n of the preceding close pair of add-compare-select units;

(C) the add-compare-select unit associated with state 2n is coupled to the next close pair of add-compare-select units and to the add-compare-select unit associated with state n+N/2 of the preceding close pair of add-compare-select units; and (D) the add-compare-select unit associated with state 2n+1 is coupled to the next close pair of add-compare-select units and to the add-compare-select unit associated with state n+N/2 of the preceding close pair of add-compare-select units.

3. The integrated structure of claim 2, wherein each add-compare-select unit of a respective pair of add-compare-select units is connected to two groups of branch metric supply lines out of four groups of branch metric supply lines, the four groups of branch metric supply lines being common to each add-compare-select unit in the respective column.

4. The integrated structure of claim 3, wherein each add-compare-select unit includes first, second, and third groups of pads for establishing connections with the next close pair of add-compare-select units and the add-compare-select units associated with states n and n+N/2, respectively, and fourth and fifth groups of pads for establishing connections with the two groups of branch metric supply lines, respectively, all pads being arranged according to a topology common to all add-compare-select units.

5. The integrated structure of claim 4, wherein pads included in each group of pads are distributed along a width of the respective column, pads associated with most significant bits being located away from the common channel, where circuitry common to the two add-compare-select units of the respective pair of add-compare-select units is integrated.

6. The integrated structure of claim 1, wherein each add-compare-select unit of a respective pair of add-compare-select units is connected to two groups of branch metric supply lines out of four groups of branch metric supply lines, the four groups of branch metric supply lines being common to each add-compare-select unit in the respective column.

7. The integrated structure of claim 6, wherein each add-compare-select unit includes first, second, and third groups of pads for establishing connections with a next close pair of add-compare-select units and the add-compare-select units associated with states n and n+N/2, respectively, and fourth and fifth groups of pads for establishing connections with the two groups of branch metric supply lines, respectively, all pads being arranged according to a topology common to all add-compare-select units.

8. The integrated structure of claim 7, wherein pads included in each group of pads are distributed along a width of the respective column, pads associated with most significant bits being located away from the common channel, where circuitry common to the two add-compare-select units of the respective pair of add-compare-select units is integrated.

9. A Viterbi convolutive decoder comprising:
a network of N add-compare-select units, each of the N add-compare-select units being respectively associated with one state of an N state trellis of the Viterbi convolutive decoder, the N add-compare-select units being physically arranged within the Viterbi decoder to form two parallel columns, each of the two parallel columns including pairs of add-compare-select units that are physically arranged along a height of a respective column, each pair of add-compare-select units including first and second add-compare-select units that are associated with states 2n and 2n+1 modulo-N, respectively, where n is a positive integer, the first add-compare-select unit being coupled, for receiving a first path metric, to an add-compare-select unit that is associated with one of states n and n+N/2 of a close pair of add-compare-select units and the second add-compare-select unit being coupled, for receiving a second path metric, to an add-compare-select unit that is associated with the other of states n and n+N/2 of a remote pair of add-compare-select units; and
a common channel to separate the two parallel columns, the common channel including interconnections between remote pairs of add-compare-select units.

10. The Viterbi convolutive decoder of claim 9, wherein each add-compare-select unit of the N add-compare-select units is distributed throughout a width of the respective column.

11. The Viterbi convolutive decoder of claim 9, wherein connections between the first and second add-compare-select units of each pair of add-compare-select units are vertical.

12. The Viterbi convolutive decoder of claim 9, wherein the common channel includes only interconnections between remote pairs of add-compare-select units.

13. The Viterbi convolutive decoder of claim 9, wherein the Viterbi convolutive decoder is integrated in a structure that includes at least three metallization layers.

14. The Viterbi convolutive decoder of claim 9, wherein each of the N add-compare-select units have a same topology.

15. The Viterbi convolutive decoder of claim 14, wherein the first and second add-compare-select units of each pair of add-compare-select units includes connection metallization that couples the first and second add-compare-select units to other pairs of add-compare-select units in one of four configurations:
(A) the first add-compare-select unit is coupled to a next close pair of add-compare-select units and to the add-compare-select unit associated with state n of a preceding close pair of add-compare-select units;
(B) the second add-compare-select unit is coupled to the next close pair of add-compare-select units and to the add-compare-select unit associated with state n of the preceding close pair of add-compare-select units;
(C) the first add-compare-select unit is coupled to the next close pair of add-compare-select units and to the add-compare-select unit associated with state n+N/2 of the preceding close pair of add-compare-select units; and
(D) the second add-compare-select unit is coupled to the next close pair of add-compare-select units and to the add-compare-select unit associated with state n+N/2 of the preceding close pair of add-compare-select units.

16. The Viterbi convolutive decoder of claim 15, wherein the first and second add-compare-select units of each pair of add-compare-select units are connected to two groups of branch metric supply lines out of four groups of branch metric supply lines, the four groups of branch metric supply lines being common to each add-compare-select unit in the respective column.

17. The Viterbi convolutive decoder of claim 16, wherein the four groups of branch metric supply lines extend through a column height of the respective column and the two groups of branch metric supply lines that are connected to the first and second add-compare-select units of each pair of add-compare-select units are connected in reduced local routing channels.

18. The Viterbi convolutive decoder of claim 16, wherein the first and second add-compare-select units of each pair of add-compare-select units each includes:
a first group of pads connected to the next close pair of add-compare-select units;
a second group of pads connected to the add-compare-select unit associated with one of states n and n+N/2 of the preceding close pair of add-compare-select units;
a third group of pads connected to the add-compare-select unit associated with the other of states n and n+N/2 of the remote pair of add-compare-select units;
a fourth group of pads connected to a first group of branch metric supply lines of the two groups of branch metric supply lines; and
a fifth group of pads connected to a second group of branch metric supply lines of the two groups of branch metric supply lines.

19. The Viterbi convolutive decoder of claim 18, wherein pads included in each group of pads are distributed along a width of the respective column, pads associated with most significant bits being located away from the common channel.

20. The Viterbi convolutive decoder of claim 19, further comprising a normalization circuit coupled to each pair of add-compare-select units and located away from the common channel.

21. A Viterbi convolutive decoder comprising:

a network of N add-compare-select units implemented in a technology having at least three metallization layers, each of the N add-compare-select units being respectively associated with one state of an N state trellis of the Viterbi convolutive decoder, the N add-compare-select units being physically arranged within the Viterbi convolutive decoder to form two parallel columns, each respective parallel column of the two parallel columns including pairs of add-compare-select units physically arranged along a column height, each pair of add-compare-select units including first and second add-compare-select units that are associated with states 2n and 2n+1 modulo-N, respectively, where n is a positive integer, the first add-compare-select unit being coupled, for receiving a first path metric, to an add-compare-select unit that is associated with one of states n and n+N/2 of a close pair of add-compare-select units and the second add-compare-select unit being coupled, for receiving a second path metric, to an add-compare-select unit that is associated with the other of states n and n+N/2 of a remote pair of add-compare-select units;

a common channel to separate the two parallel columns, the common channel including interconnections between remote pairs of add-compare-select units; and interconnection means, formed in the first and second add-compare-select units of each pair of add-compare-select units, for interconnecting the first and second add-compare-select units along a height of each respective parallel column to reduce a surface area of the network of N add-compare-select units.

22. The Viterbi convolutive decoder of claim 21, wherein the common channel includes only interconnections between remote pairs of add-compare-select units.

23. The Viterbi convolutive decoder of claim 21, wherein the interconnection means includes first connection metallization that couples the first and second add-compare-select units of each pair of add-compare-select units to other pairs of add-compare-select units in one of four configurations:

(A) the first add-compare-select unit is coupled to a next close pair of add-compare-select units and to the add-compare-select unit associated with state n of a preceding close pair of add-compare-select units;

(B) the second add-compare-select unit is coupled to the next close pair of add-compare-select units and to the add-compare-select unit associated with state n of the preceding close pair of add-compare-select units;

(C) the first add-compare-select unit is coupled to the next close pair of add-compare-select units and to the add-compare-select unit associated with state n+N/2 of the preceding close pair of add-compare-select units; and (D) the second add-compare-select unit is coupled to the next close pair of add-compare-select units and to the add-compare-select unit associated with state n+N/2 of the preceding close pair of add-compare-select units.

24. The Viterbi convolutive decoder of claim 23, further comprising four groups of branch metric supply lines extending along the height of each of the respective parallel columns and in common with both the respective parallel columns, wherein the interconnection means further includes second connection metallization that connects the first and second add-compare-select units of each pair of add-compare-select units in the respective parallel column to two groups of branch metric supply lines of the four groups of branch metric supply lines.

25. The Viterbi convolutive decoder of claim 24, wherein:

the first connection metallization includes a first group of pads connected to the next close pair of add-compare-select units, a second group of pads connected to the add-compare-select unit associated with one of states n and n+N/2 of the preceding close pair of add-compare-select units, and a third group of pads connected to the add-compare-select unit associated with the other of states n and n+N/2 of the remote pair of add-compare-select units; and the second connection metallization includes a fourth group of pads connected to a first group of branch metric supply lines of the two groups of branch metric supply lines, and a fifth group of pads connected to a second group of branch metric supply lines of the two groups of branch metric supply lines.

26. The Viterbi convolutive decoder of claim 25, wherein pads included in each group of pads are distributed along a width of the respective column, pads associated with most significant bits being located away from the common channel.

27. The Viterbi convolutive decoder of claim 26, further comprising a normalization circuit coupled to each pair of add-compare-select units and located away from the common channel.

28. The Viterbi convolutive decoder of claim 21, further comprising four groups of branch metric supply lines extending along the height of each of the respective parallel columns and in common with both the respective parallel columns, wherein the interconnection means includes connection metallization that connects the first and second add-compare-select units of each pair of add-compare-select units in the respective parallel column to two groups of branch metric supply lines of the four groups of branch metric supply lines.

* * * * *